(12) United States Patent
Barriss et al.

(10) Patent No.: US 10,718,052 B2
(45) Date of Patent: Jul. 21, 2020

(54) ROTATING DISK REACTOR WITH FERROFLUID SEAL FOR CHEMICAL VAPOR DEPOSITION

(71) Applicant: Veeco Instruments Inc., Plainview, NY (US)

(72) Inventors: Louise S. Barriss, North Reading, MA (US); Richard A. Comunale, Ipswich, MA (US); Roger P. Fremgen, Northport, NY (US); Alexander I. Gurary, Bridgewater, NJ (US); Todd A. Luse, Quakertown, PA (US); Robert White Milgate, Lexington, KY (US); John D. Pollock, Rowley, MA (US)

(73) Assignee: Veeco Instruments, Inc., Plainview, NY (US)

( * ) Notice: Subject to any disclaimer, the term of this patent is extended or adjusted under 35 U.S.C. 154(b) by 346 days.

(21) Appl. No.: 15/382,216

(22) Filed: Dec. 16, 2016

(65) Prior Publication Data
US 2017/0096734 A1 Apr. 6, 2017

Related U.S. Application Data

(63) Continuation of application No. 14/390,345, filed as application No. PCT/US2013/040246 on May 9, 2013.
(Continued)

(51) Int. Cl.
*C23C 16/458* (2006.01)
*H01L 21/687* (2006.01)
(Continued)

(52) U.S. Cl.
CPC ...... *C23C 16/4584* (2013.01); *C23C 16/4586* (2013.01); *C23C 16/46* (2013.01);
(Continued)

(58) Field of Classification Search
None
See application file for complete search history.

(56) References Cited

U.S. PATENT DOCUMENTS 4,275,282 A * 6/1981 Miller ............... C23C 14/505
118/730
5,063,031 A 11/1991 Sato
(Continued)

FOREIGN PATENT DOCUMENTS

CN 101246835 A 8/2008
EP 0 748 881 A1 12/1996
(Continued)

OTHER PUBLICATIONS

"Office Action" for Korean Patent Application No. 10-2016-7003464, dated Mar. 27, 2018, 7 pages, Korean Intellectual Property Office, Republic of Korea.
(Continued)

*Primary Examiner* — Charlee J. C. Bennett
(74) *Attorney, Agent, or Firm* — Kurt Rauschenbach; Rauschenbach Patent Law Group, PLLC

(57) ABSTRACT

A rotating disk reactor for chemical vapor deposition includes a vacuum chamber and a ferrofluid feedthrough comprising an upper and a lower ferrofluid seal that passes a motor shaft into the vacuum chamber. A motor is coupled to the motor shaft and is positioned in an atmospheric region between the upper and the lower ferrofluid seal. A turntable is positioned in the vacuum chamber and is coupled to the motor shaft so that the motor rotates the turntable at a desired rotation rate. A dielectric support is coupled to the turntable so that the turntable rotates the dielectric support when driven by the shaft. A substrate carrier is positioned on the dielectric support in the vacuum chamber for chemical vapor deposition processing. A heater is positioned proxi-
(Continued)

mate to the substrate carrier that controls the temperature of the substrate carrier to a desired temperature for chemical vapor deposition.

21 Claims, 10 Drawing Sheets

Related U.S. Application Data

(60) Provisional application No. 61/781,858, filed on Mar. 14, 2013, provisional application No. 61/648,646, filed on May 18, 2012, provisional application No. 61/648,640, filed on May 18, 2012.

(51) Int. Cl.

| | | |
|---|---|---|
| *C30B 25/12* | (2006.01) | |
| *C23C 16/46* | (2006.01) | |
| *C30B 25/08* | (2006.01) | |
| *C30B 25/10* | (2006.01) | |
| *C23C 16/52* | (2006.01) | |

(52) U.S. Cl.
CPC .............. *C23C 16/52* (2013.01); *C30B 25/08* (2013.01); *C30B 25/10* (2013.01); *C30B 25/12* (2013.01); *H01L 21/68785* (2013.01); *H01L 21/68792* (2013.01)

(56) References Cited

U.S. PATENT DOCUMENTS

| | | | | |
|---|---|---|---|---|
| 5,267,607 | A | | 12/1993 | Wada |
| 5,628,683 | A | * | 5/1997 | Gentischer ............... B01L 1/04 414/217 |
| 5,660,472 | A | * | 8/1997 | Peuse .................... G01J 5/0003 374/126 |
| 5,720,590 | A | * | 2/1998 | Hofmeister .............. B25J 9/107 414/744.2 |
| 5,871,586 | A | * | 2/1999 | Crawley ........... C23C 16/45514 118/715 |
| 5,897,380 | A | | 4/1999 | White et al. |
| 5,902,407 | A | | 5/1999 | Deboer et al. |
| 6,074,696 | A | | 6/2000 | Sato |
| 6,080,241 | A | | 6/2000 | Li et al. |
| 6,090,210 | A | | 7/2000 | Ballance et al. |
| 6,197,121 | B1 | | 3/2001 | Gurary et al. |
| 6,234,788 | B1 | | 5/2001 | Lee |
| 6,500,266 | B1 | | 12/2002 | Ho |
| 7,270,708 | B2 | | 9/2007 | Yoshida et al. |
| 7,368,018 | B2 | | 5/2008 | Yamaguchi |
| 8,324,063 | B2 | | 12/2012 | Fujikawa et al. |
| 8,986,453 | B2 | | 3/2015 | Kappeler et al. |
| 2002/0094600 | A1 | * | 7/2002 | Aburatani ........... C23C 16/4584 438/100 |
| 2006/0269390 | A1 | | 11/2006 | Nakamura et al. |
| 2006/0281310 | A1 | | 12/2006 | Smith et al. |
| 2007/0059149 | A1 | * | 3/2007 | Rich .................... B65G 47/914 414/752.1 |
| 2008/0073324 | A1 | * | 3/2008 | Nogami ............ H01L 21/02087 216/58 |
| 2009/0250007 | A1 | * | 10/2009 | Kim ..................... C23C 14/243 118/726 |
| 2012/0128450 | A1 | * | 5/2012 | Caveney ........... H01L 21/67742 414/217 |

FOREIGN PATENT DOCUMENTS

| | | |
|---|---|---|
| JP | 61-215289 | 9/1986 |
| JP | 62-118519 | 5/1987 |
| JP | 2-184-020 | 7/1990 |
| JP | 02-184020 | 7/1990 |
| JP | 04-157717 | 5/1992 |
| JP | 4-157717 | 5/1992 |
| JP | 08-139171 | 5/1996 |
| JP | 8-139171 | 5/1996 |
| JP | 09-241850 | 9/1997 |
| JP | 2001-274146 | 5/2001 |
| JP | 2001-274146 | 10/2001 |
| JP | 2001-297987 | 10/2001 |
| JP | 2001-297987 A | 10/2001 |
| JP | 2002-164685 | 6/2002 |
| JP | 2002-212729 | 7/2002 |
| JP | 2003-109907 A | 4/2003 |
| JP | 3-617860 B2 | 2/2005 |
| JP | 2005-086117 A | 3/2005 |
| JP | 2005086117 A | 3/2005 |
| JP | 2007-042844 | 2/2007 |
| JP | 2007-42844 | 2/2007 |
| JP | 2009-088088 | 4/2009 |
| JP | 2010-129764 | 6/2010 |
| JP | 2010-225999 | 10/2010 |
| JP | 2012-084892 | 4/2012 |
| JP | 2012-84892 | 4/2012 |
| JP | 2015-512693 | 5/2013 |
| SG | 11201406137V | 11/2014 |
| TW | 201145446 A1 | 12/2011 |
| WO | 2013/173152 A1 | 11/2013 |

OTHER PUBLICATIONS

"European Extended Search Report" For European Patent Application No. 13791326.5, dated Mar. 18, 2016, 9 pages, European Patent Office, Munich, Germany.

"Office Action" For Chinese Patent Office No. 2013800258877.3, dated Dec. 11, 2015, 10 Pages, State Intellectual Property Office of the People's Republic of China, China.

"Office Action" For Korean Patent Office No. 10-2014-7031643, dated Dec. 10, 2015, 4 Pages, Korean Intellectual Property Office, South Korea.

"Written Opinion" For Singapore Patent Application No. 10201501087Y, dated Feb. 3, 2017, 6 pages, Intellectual Property Office of Singapore, Singapore.

"Office Action" for Japanese Patent Application No. 2016-131313, dated Aug. 16, 2017, 2 pages, Japanese Patent Office, Japan.

Notice of Allowance for Japanese Patent Application No. 2015-512693, dated Jun. 26, 2017, 3 pages, Japanese Patent Office, Japan.

"Office Action" for Japanese Patent Application No. 2015-512693, dated Dec. 12, 2016, 3 pages, Japanese Intellectual Property Office, Japan.

"Notice of Eligibility for Grant" For Singapore Patent Application No. 10201501087Y, dated Nov. 27, 2017, 5 pages, Intellectual Property Office of Singapore, Singapore.

"Examination Report" For European Patent Application No. 13791326.5-1103, dated Feb. 20, 2019, 6 pages, European Patent Office, Rijswkijk, Netherlands.

"Notice of Allowance" For Chinese Patent Application No. 201610120769.6, dated Mar. 4, 2019, 2 pages, State Intellectual Property Office of the People's Republic of China, Beijing, China.

"Notification of the Third Office Action" for Chinese Patent Application 201610120769.9, dated Sep. 27, 2018, 3 Pages, The State Intellectual Property Office of the People's Republic of China, Beijing, China.

"Written Opinion" For Singapore Patent Application No. 10201501087Y, dated Dec. 1, 2015, 9 pages, Intellectual Property Office of Singapore, Singapore.

"Office Action" for Japanese Patent Application No. 2015-512693, dated Dec. 25, 2015, 6 pages, Japanese Patent Office.

"Second Office Action" For Chinese Patent Application No. 201610120769.6, dated Jun. 26, 2018, 3 pages, State Intellectual Property Office of the People's Republic of China, China.

"Notice of Allowance" for Korean Patent Application No. 10-2016-7003464, dated Jun. 1, 2018, 2 pages, The Korean Intellectual Property Office, Korea.

"Office Action" For Taiwanese Patent Application No. 102117105, dated Nov. 20, 2015, 7 pages, Intellectual Property Office, Taiwan.

(56) References Cited

OTHER PUBLICATIONS

"Office Action" For Korean Patent Application No. 10-2014-7031643, dated Jun. 27, 2016, 7 pages, Korean Intellectual Property Office, Republic of Korea.
"Notification Concerning Transmittal of International Preliminary Report on Patentability (Chapter I of the Patent Cooperation Treaty" For PCT/US2013/040246, dated Nov. 27, 2014, 13 pages, The International Bureau of WIPO, Geneva, Switzerland.
"Office Action" For Taiwanese Patent Application No. 105105158, dated Jul. 26, 2016, 9 pages, Taiwanese Patent Office, Taiwan.
"Search Report" For Taiwanese Patent Application No. 105105158, dated Jul. 19, 2016, 1 page, Taiwanese Patent Office, Taiwan.
"Office Action" For Chinese Patent Application No. 201380025887.3, dated May 26, 2016, 3 pages, State Intellectual Property Office of the People's Republic of China, Beijing, China.
"Supplementary Examination Report" for Singapore Patent Application No. 11201406137V, dated Jul. 23, 2015, 3 pages, Intellectual Property Office of Singapore, Manulife Centre, Singapore.

* cited by examiner

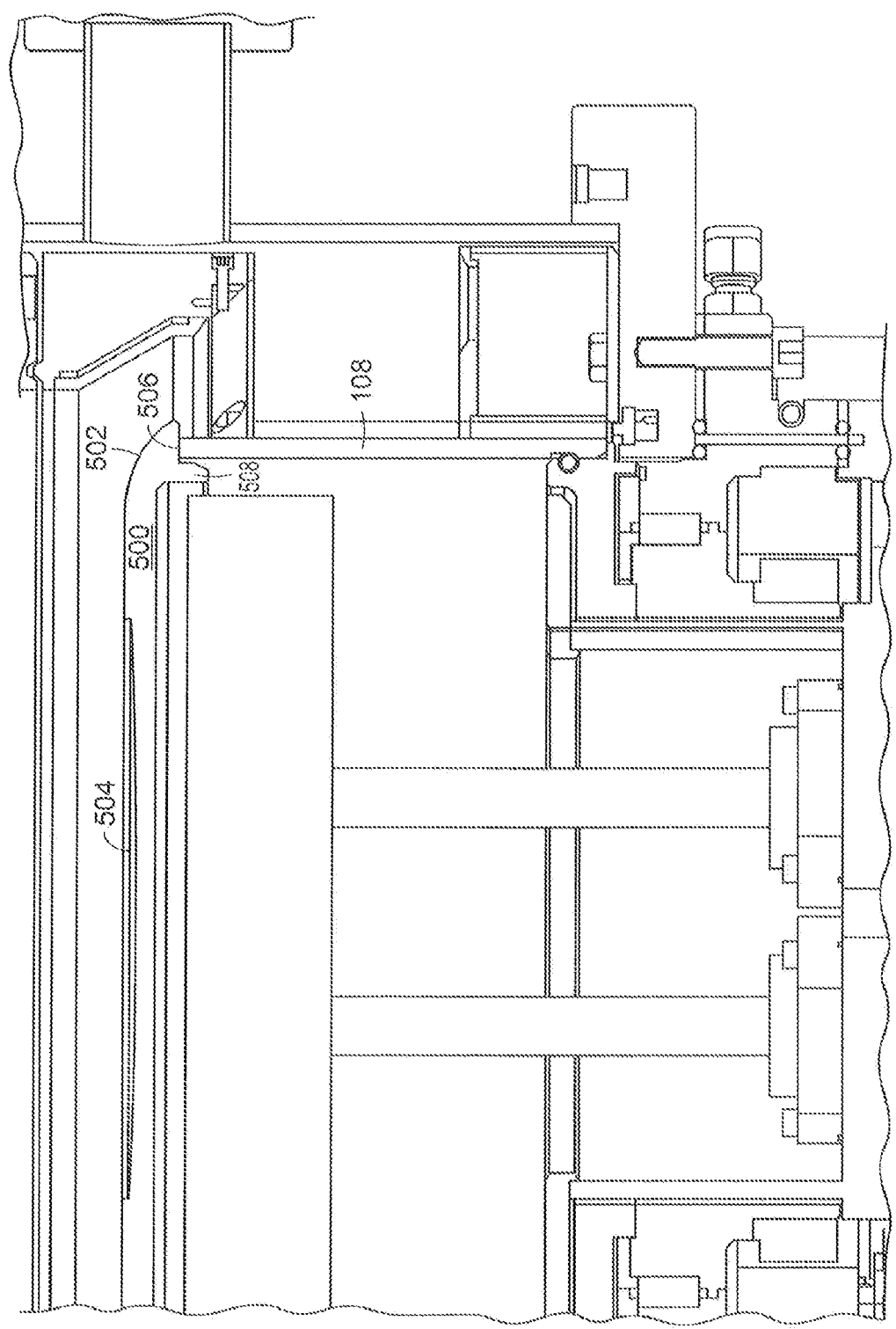

ROTATING DISK REACTOR WITH FERROFLUID SEAL FOR CHEMICAL VAPOR DEPOSITION

RELATED APPLICATION SECTION

The present application is a Continuation of U.S. Ser. No. 14/390,345 filed Oct. 2, 2014, entitled "Rotating Disk Reactor With Ferrofluid Seal For Chemical Vapor Deposition" which is a 35 U.S.C. § 371 application based on International Patent Application Number PCT/US13/40246 filed May 9, 2013, entitled "Rotating Disk Reactor With Ferrofluid Seal For Chemical Vapor Deposition" which claims priority to U.S. Provisional Patent Application No. 61/648,640, filed on May 18, 2012, entitled "Rotating Disk For Chemical Vapor Deposition," U.S. Provisional Patent Application No. 61/781,858 filed on Mar. 14, 2013, entitled "Rotating Disk Reactor with Ferrofluid Seal for Chemical Vapor Deposition," and to U.S. Provisional Patent Application No. 61/648,646, filed on May 18, 2012, entitled "Substrate Carrier For Chemical Vapor Deposition." The entire contents of U.S. patent application Ser. No. 14/390,345, International Patent Application Number PCT/US13/40246, and U.S. Provisional Patent Application Nos. 61/648,640, 61/781,858, and 61/648,646 are herein incorporated by reference.

The section headings used herein are for organizational purposes only and should not be construed as limiting the subject matter described in the present application in any way.

INTRODUCTION

Vapor phase epitaxy (VPE) is a type of chemical vapor deposition (CVD), which involves directing one or more gases containing chemical species onto a surface of a substrate so that the reactive species react and form a film on the surface of the substrate. For example, VPE systems can be used to grow compound semiconductor materials on substrates.

Materials are typically grown by injecting at least one precursor gas and, in many processes, at least a first and a second precursor gas into a process chamber containing the crystalline substrate. Compound semiconductors, such as III-V semiconductors, can be formed by growing various layers of semiconductor materials on a substrate using a hydride precursor gas and an organometallic precursor gas. Metalorganic vapor phase epitaxy (MOVPE) is a vapor deposition method that is commonly used to grow compound semiconductors using a surface reaction of metalorganics and hydrides containing the required chemical elements. For example, indium phosphide could be grown in a reactor on a substrate by introducing trimethylindium and phosphine.

Alternative names for MOVPE used in the art include organometallic vapor phase epitaxy (OMVPE), metalorganic chemical vapor deposition (MOCVD), and organometallic chemical vapor deposition (OMCVD). In these processes, the gases are reacted with one another at the growth surface of a substrate, such as a sapphire, Si, GaAs, InP, InAs or GaP substrate, to form a III-V compound of the general formula $In_XGa_YAl_ZN_AAs_BP_CSb_D$, where X+Y+Z equals approximately one, and A+B+C+D equals approximately one, and each of X, Y, Z, A, B, C, and D can be between zero and one. In various processes, the substrate can be a metal, semiconductor, or an insulating substrate. In some instances, bismuth may be used in place of some or all of the other Group III metals.

Compound semiconductors, such as III-V semiconductors, can also be formed by growing various layers of semiconductor materials on a substrate using a hydride or a halide precursor gas process. In one halide vapor phase epitaxy (HVPE) process, Group III nitrides (e.g., GaN, AlN) are formed by reacting hot gaseous metal chlorides (e.g., GaCl or AlCl) with ammonia gas ($NH_3$). The metal chlorides are generated by passing hot HCl gas over the hot Group III metals. One feature of HVPE is that it can have a very high growth rate, up to 100 μm per hour for some state-of-the-art processes. Another feature of HVPE is that it can be used to deposit relatively high quality films because films are grown in a carbon free environment and because the hot HCl gas provides a self-cleaning effect.

In these processes, the substrate is maintained at an elevated temperature within a reaction chamber. The precursor gases are typically mixed with inert carrier gases and are then directed into the reaction chamber. Typically, the gases are at a relatively low temperature when they are introduced into the reaction chamber. As the gases reach the hot substrate, their temperatures, and hence their available energies for reaction, increase. Formation of the epitaxial layer occurs by final pyrolysis of the constituent chemicals at the substrate surface. Crystals are formed by a chemical reaction on the surface of the substrate and not by physical deposition processes. Consequently, VPE is a desirable growth technique for thermodynamically metastable alloys. Currently, VPE is commonly used for manufacturing laser diodes, solar cells, and light emitting diodes (LEDs).

SUMMARY OF THE INVENTION

A rotating disk reactor for chemical vapor deposition includes a vacuum chamber and a ferrofluid feedthrough, comprising an upper and a lower ferrofluid seal that passes a motor shaft into the vacuum chamber. In some embodiments, the ferrofluid feedthrough forms a hollow conduit to provide electrical and plumbing utilities to the vacuum chamber. A motor is coupled mechanically or magnetically to the motor shaft and is positioned in an atmospheric region between the upper and the lower ferrofluid seal. A turntable is positioned in the vacuum chamber and is coupled to the motor shaft so that the motor rotates the turntable at a desired rotation rate. In some embodiments, the turntable is coupled to the motor shaft by a flexible means. Also, in some embodiments, the motor shaft is coupled to the turntable in a region offset from a center of rotation of the turntable.

A dielectric support, such as a quartz support, is coupled to the turntable so that the turntable rotates the dielectric support when driven by the shaft. A substrate carrier is positioned on the dielectric support in the vacuum chamber for chemical vapor deposition processing. In various embodiments, the substrate carrier can be held on top of the dielectric support by friction between a top surface of the dielectric support and a bottom surface of the substrate carrier, or it can be physically attached. The substrate carrier can be adapted to support a single substrate or multi-substrates. In some embodiments, the dielectric support is formed of a material that establishes a thermal barrier between the substrates being processed and a cool region in the vacuum chamber.

A heater is positioned proximate to the substrate carrier that controls the temperature of the substrate carrier to a desired temperature for chemical vapor deposition. The heater can be positioned inside or outside of the dielectric support. The heater may include two or more independent heater zones. The heater may be a graphite heater, or may include a tungsten and/or rhenium coil heater.

Also, a substrate carrier for chemical vapor deposition includes a body that is generally circular. The substrate carrier can be formed of at least one of graphite, SiC, metal, or ceramic material. The substrate carrier can be formed of material having a thermal expansion coefficient, which results in an expansion of the substrate carrier that more tightly holds the substrate carrier on top of the rotating support. The substrate carrier's weight is chosen such that, during processing and purging, the substrate carrier is frictionally attached to a top surface of a rotating support.

A top surface of the substrate carrier has a recessed area for receiving a substrate. The recessed area can comprise tabs for supporting the substrate. The tabs may be triangular in shape. The tabs can be formed of a material that absorbs at least some of the force generated when the substrate carrier expands against the substrate. Also, the tabs can reduce mechanical stresses on the substrate as the temperature of the substrate carrier increases.

The recessed area of the substrate carrier can be machined in localized areas to a predetermined depth contour, which results in a desired thermal characteristic across the substrate carrier. In addition, the recessed area of the substrate carrier can include inserts of material in localized areas, resulting in a desired thermal characteristic across the substrate carrier. Furthermore, the recessed area of the substrate carrier can comprise a multi-level bottom surface. At least one thermal property of the material in the localized area can be different from the thermal property of the material forming the substrate carrier.

A rounded edge of the substrate carrier has a shape that reduces thermal loss and increases uniformity of process gasses flowing over the substrate. The substrate carrier has a substantially flat surface at the bottom of the rounded edge for positioning on top of a rotating support structure. In addition, the substrate carrier has a vertical rim positioned proximate to the rounded edge that reduces wobbling of the substrate carrier when positioned on top of the rotating support. The vertical rim is dimensioned to secure the substrate carrier on top of a rotating support at a desired rotation rate.

BRIEF DESCRIPTION OF THE DRAWINGS

The present teaching, in accordance with preferred and exemplary embodiments, together with further advantages thereof, is more particularly described in the following detailed description taken in conjunction with the accompanying drawings. The skilled person in the art will understand that the drawings, described below, are for illustration purposes only. The drawings are not necessarily to scale, emphasis instead generally being placed upon illustrating principles of the teaching. In the drawings, like reference characters generally refer to like features and structural elements throughout the various figures. The drawings are not intended to limit the scope of the Applicants' teaching in any way.

FIG. 7 illustrates a side-view of the single substrate carrier, according to the present teaching, that was described in connection with FIG. 5, which is positioned on top of a rotating support.

DESCRIPTION OF VARIOUS EMBODIMENTS

Reference in the specification to "one embodiment" or "an embodiment" means that a particular feature, structure, or characteristic, described in connection with the embodiment, is included in at least one embodiment of the teaching. The appearances of the phrase "in one embodiment" in various places in the specification are not necessarily all referring to the same embodiment.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications, and equivalents, as will be appreciated by those of skill in the art. Those of ordinary skill in the art, having access to the teaching herein, will recognize additional implementations, modifications, and embodiments, as well as other fields of use, which are within the scope of the present disclosure as described herein.

The present teaching relates to methods and apparatuses for chemical vapor deposition, including MOCVD. More particularly, the present teaching relates to methods and apparatuses for chemical vapor deposition using vertical reactors in which the substrates are located on a rotating disk. Recently, there has been tremendous growth in the LED and OLED markets. Also, there have been significant advances in semiconductor power, which have increased their utility. Consequently, there has been an increased demand for efficient and high throughput CVD and MOCVD manufacturing systems and methods to fabricate these devices. There is a particular need for manufacturing systems and methods that improve deposition uniformity without negatively impacting the maintenance and operating parameters, such as rotation rate of the substrate carrier.

Aspects of the present teaching are described in connection with a single substrate CVD reactor. However, one skilled in the art will appreciate that the methods and apparatus of the present teaching can be implemented with a multi-substrate reactor. In addition, the CVD reactor of the present teaching can be scaled to any size substrate.

Figure 1:
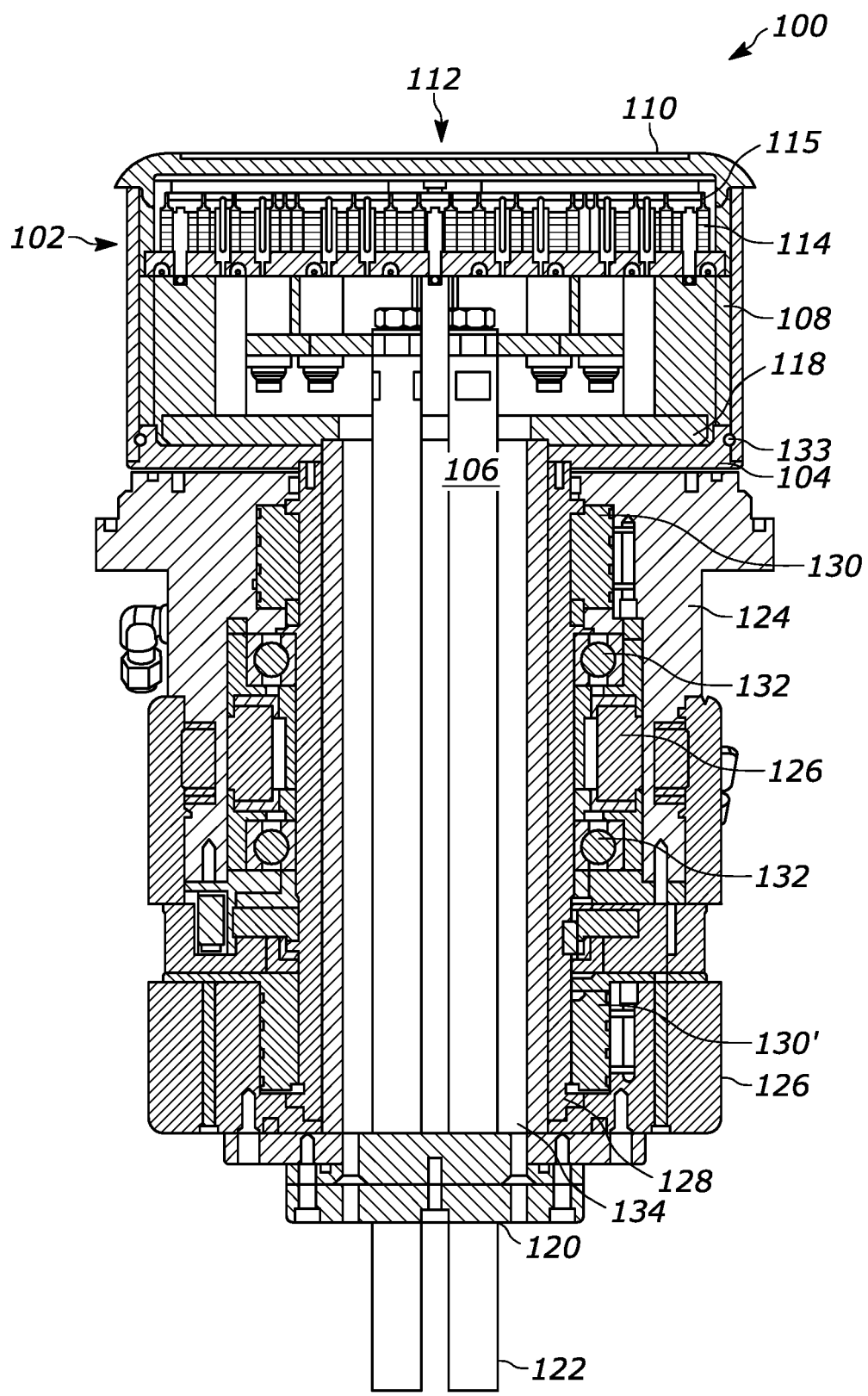
FIG. 1 illustrates a cross section of one embodiment of a CVD reactor, according to the present teaching.

FIG. 1 illustrates a cross section of one embodiment of a CVD reactor 100 according to the present teaching. The CVD reactor 100 includes a vacuum chamber 102, which is often formed of stainless steel. The vacuum chamber 102 provides a vacuum environment for CVD processing of a single substrate or of a batch of substrates. One example of a process that can be performed with a CVD reactor, according to the present teaching, is depositing thin films by CVD, such as GaN based, thin films grown on sapphire substrates for LED manufacturing.

A turntable 104 is positioned in a cool region 106 of the vacuum chamber 102. The cool region 106 is maintained at a relatively low temperature during normal processing conditions so that it can enclose relatively low temperature components. The bottom of the turntable 104 includes a bearing or guide wheel system that allows for rotation. A rotating dielectric support 108 is positioned on top of the turntable 104. The dielectric support 108 can be mechanically or magnetically coupled to the turntable 104 by various means. In one embodiment of the present teaching, the dielectric support 108 is a hollow dielectric cylinder or tube that attaches to the turntable 104 as shown in FIG. 1. In various other embodiments, the rotating dielectric support 108 is formed of various other shapes. One aspect of the present teaching is that the length of the rotating dielectric support 108 can be significantly shorter than similar structures formed of metallic materials or high thermal conductivity dielectric materials, which are used in other known CVD reactors.

A substrate carrier 110 is positioned on top of the rotating dielectric support 116. The substrate carrier 100 is described in more detail in connection with FIGS. 5-7. The substrate carrier 110 has at least one recessed portion that is dimensioned to receive at least one substrate for processing. In one specific embodiment, the substrate carrier 110 is a single substrate carrier. Single substrate carriers can provide numerous processing advantages. For example, single substrate carriers can provide greater temperature uniformity across the substrate compared with multi-substrate carriers. Also, single substrate carriers can provide higher throughput and greater protection of critical components from reactive process chemistries. Also, single substrate carriers can provide improved gas efficiency. A single substrate carrier may allow for fewer points of contact than a multi-wafer carrier, because centrifugal forces will be lower. Furthermore, single substrate carriers generally take shorter time periods to achieve the desired rotation speed. Finally, single substrate carriers can be less expensive than multi-substrate carriers. However, in other embodiments of the present teaching, the substrate carrier 110 is a multi-substrate carrier that is used for batch processing.

The substrate carrier 110 can be mechanically attached to the rotating dielectric support 108 or can be freely positioned on the top surface of the rotating dielectric support 108 and held in place by only friction. The CVD system of the present teaching uses various means of thermal isolation or thermal breaking in the interface between the substrate carrier 110 and the rotating dielectric support 108. One such means of thermal breaking is to form rounded edges of the substrate carrier 110 to reduce thermal losses at the edge of the substrate carrier 110. Another means for thermal breaking is to reduce heat transfer between the bottom of the substrate carrier 110 and the dielectric support 108.

In some embodiments, a shutter or gate in the vacuum chamber 102 opens to allow the substrate carrier 110 to transfer into and out of a reaction area 112 of the vacuum chamber 102. In many embodiments, the substrate carrier 110 has a lip or other edge feature, which allows a robotic arm to transport it into and out of the vacuum chamber 102.

A heater assembly 114 is positioned proximate to the substrate carrier 110. In some CVD reactors, according to the present teaching, the heater assembly 114 generates process temperatures that are up to about 1,300 degrees C. In many embodiments, the heater assembly 114 is positioned inside of the rotating dielectric support 108 proximate to and below the substrate carrier 110 so that there is strong thermal communication between the heater assembly 114 and the substrate carrier 110. However, in other embodiments, the heater assembly 114 is positioned outside of the rotating dielectric support 108. The heater assembly 114 can be a single zone heater or can have any number of heater zones. For example, in one specific embodiment, the heater assembly 114 comprises a two-zone heater assembly. In some embodiments, thermal radiation shields are positioned proximate to the heater assembly 114. In some embodiments, some portions of the heater assembly 114 are fluid cooled.

In one embodiment, the heater assembly 114 is a radiant heater comprising heater coils supported by insulators 116 positioned adjacent to the substrate carrier 110, which electrically and thermally isolate the heating elements 115. In some embodiments, the heater assembly 114 comprises graphite heater coils. Heating coils in most known systems are not generally made from graphite and instead use much more costly materials. Graphite heater elements are typically not used because some common CVD process gases, such as ammonia, attack and degrade the graphite at high temperatures resulting in process non-uniformities and increased system maintenance. Instead, some known systems use graphite heaters that are coated with at least one protective layer of material. However, these systems are typically limited to lower temperature processes because, at high processing temperatures, the different thermal expansion rates between the graphite and the coating material(s) cause cracking and flaking of the coating material(s), which can result in contamination and increased maintenance. In other embodiments, the heater assembly 114 comprises tungsten and/or rhenium heater coils.

In one particular embodiment, the heater assembly 114 is supported by a base plate 118, or similar structure, to position the heater assembly 114 under and in close proximity to the substrate carrier 110. A heater mounting tube 160 supports the heater base plate 118. The heater baseplate can be water-cooled. The vacuum chamber 102 includes power feedthroughs 120 to pass electrodes 122 through the vacuum chamber 102 to connect with and electrically power the heater assembly 114, while maintaining a vacuum in the vacuum chamber 102 of the reactor 100. The electrical conductors 122 connect to the heating elements 115 with high temperature conductors, such as one made of a refractor material like molybdenum.

The CVD reactor 100 includes a gas manifold that introduces process gasses into the vacuum chamber 102 proximate to the substrate or substrates being processed. One aspect of CVD reactors of the present teaching, is that process gases do not flow inside of the rotating dielectric support 116. Process gasses can be prevented from entering the heater assembly 114 area by purging the heater assembly 114 area with an inert gas, such as nitrogen, at a pressure which is higher than the pressure in the vacuum chamber 102 proximate to the substrate carrier 110. This purging will limit the amount of process gases flowing into contact with the heater assembly 114. This allows less costly graphite heaters to be used.

In one embodiment, the rotating dielectric support 108 is formed of quartz. Quartz is a particularly good dielectric material for the dielectric support 108 because it is relatively inexpensive. Quartz can also be used with high processing temperatures. In addition, quartz has a very low coefficient of thermal expansion so the dimensions of the dielectric material do not change significantly during high temperature processing. In addition, quartz has low thermal conductivity, only about 1.3 W/(m·K), so it functions as a thermal barrier between the substrates being processed and the cool region 106. Using quartz will reduce or minimize temperature non-uniformities on the substrate carrier 110. Low thermal conductivity, as described herein, is generally defined to mean less than 10 W/(m K). This is much lower than some other dielectric materials commonly used in material processing systems, such as boron nitride. There are several different kinds of boron nitride, but its thermal conductivity can be in the range of 20-120 W/(m·K).

Using a quartz dielectric support 108 has several design advantages. For example, a quartz dielectric support 108 can be much shorter in dimension compared with similar CVD reactors that use metal or high thermal conductivity dielectric materials, because less material will be needed to thermally isolate the substrate carrier 110 from the cool region 106. Shorter dielectric supports will result in smaller reactors that are much less expensive to manufacture and also to operate. For example, lower capacity vacuum pumps can be used. Also, less power will be required to maintain the substrate carrier 110 at the desired operating temperature. In addition, a shorter support will have less wobble in the substrate carrier 110 and, therefore, improve process uniformity.

Another design advantage of using quartz for the dielectric support 114 is that the thermal expansion coefficient of a quartz dielectric support 114 will be many times lower than the thermal expansion coefficient of the substrate carrier 110. In some systems, the thermal expansion coefficient of the quartz dielectric support 114 will be about ten times lower than the thermal expansion coefficient of the substrate carrier 110 formed of materials such as molybdenum or graphite. Therefore, as the substrate carrier 110 heats up it will expand at a much greater rate than the quartz dielectric support 114. The mismatch in CTE's can be used by design to cause the substrate carrier 110 to center itself with respect to the quartz dielectric support 114 as temperatures rise. The substrate carrier 110 will be become more concentric to the quartz dielectric support 114 and thus held in place more firmly as the temperature increases, which will result in improved process uniformity.

Another design advantage of using quartz for the dielectric support 108 is that it will be much easier for the heater assembly 114 to maintain a uniform processing temperature over the entire substrate carrier 110. This is because there is much less thermal loss at the edge of the carrier compared with metal and high thermal conductivity dielectric supports. Quartz, and other very low thermal conductivity materials, function as thermal breaks to prevent the dielectric support 108 from functioning like a heat sink and lowering the substrate carrier 110 temperature at the edges.

An upper housing 124 encloses a motor 126. The motor 126 rotates the shaft 128, which in turn rotates the turntable 108 and the substrate carrier 110 positioned on the turntable 104. Other parts of the CVD reactor 100 are stationary. The motor 126 rotates these components at speeds up to about 1,200 RPM. However, in various embodiments, the motor 126 rotates these components at rates that can be significantly higher. In the embodiment shown, the motor 110 is mechanically coupled to the turntable 104 by a shaft 128 through a ferrofluid feedthrough that comprises an upper ferrofluid seal 130 and a lower ferrofluid seal 130', which is described further in FIGS. 3, 4A and 4B.

One feature of the present teaching is that the connection of the shaft 128 to the turntable 104 is offset from the center of the substrate carrier 110. In contrast, many known CVD reactors use a center shaft design that essentially balances the substrate carrier 110 on the shaft 128. The shaft 128 design and geometry of the present teaching provides a more robust mechanical connection between the motor 126 and the substrate carrier 110 to allow for a reduced time to achieve maximum rotation speed with minimal vibration. Consequently, the shaft 128 design and geometry of the present teaching provides a faster ramp of the substrate carrier 110 to the desired rotation rate, which results in better process control with higher throughput. In addition, the shaft 128 design and geometry of the present teaching enables the substrate to be positioned in the center of the substrate carrier 110. Consequently, there will not be significant temperature variations in the center of the substrate carrier 110 that are caused by a center shaft.

In one embodiment, the shaft 128 contains some dielectric material. For example, the shaft 128 can be formed, at least in part, of quartz or boron nitride. Dielectric materials have some advantages over metal. For example, dielectric materials will remain cooler during some processing conditions and, therefore, will provide less thermal loss compared with metal shafts and will also reduce heat transfer to the motor and other components in the cool section 106. For example, a shaft 128 formed of quartz will significantly reduce thermal losses compared to a metal shaft.

Motor bearings 132 are positioned adjacent to the shaft 128 on either side of the motor 126 to guide the shaft 128 as it rotates. In some embodiments, the motor bearings 132 are purged with air or an inert gas. Also, in many embodiments, the motor bearings 132 are air or fluid cooled to maintain low maintenance operating conditions. For example, the bearings 132 can be water-cooled. In some embodiments, the motor 126 is cooled to less than 50 degrees C. during normal processing conditions.

The shaft 128 is attached to the turntable 104 by a flexible means that allows for different rates of thermal expansion between the turntable 104 and the rotating dielectric support 108. For example, the rotating dielectric support 108 can be connected at its lower end to a flat circular plate by a spring, such as a canted coil spring 133 that centers and locks the rotating dielectric support 108 to the turntable 104 without using conventional, non-flexible fasteners. Such an attachment means keeps the dielectric support 108 concentric with the circular plate and allows for differential thermal expansion to occur without stressing and possibly fracturing the rotating dielectric support 108.

Figure 2:
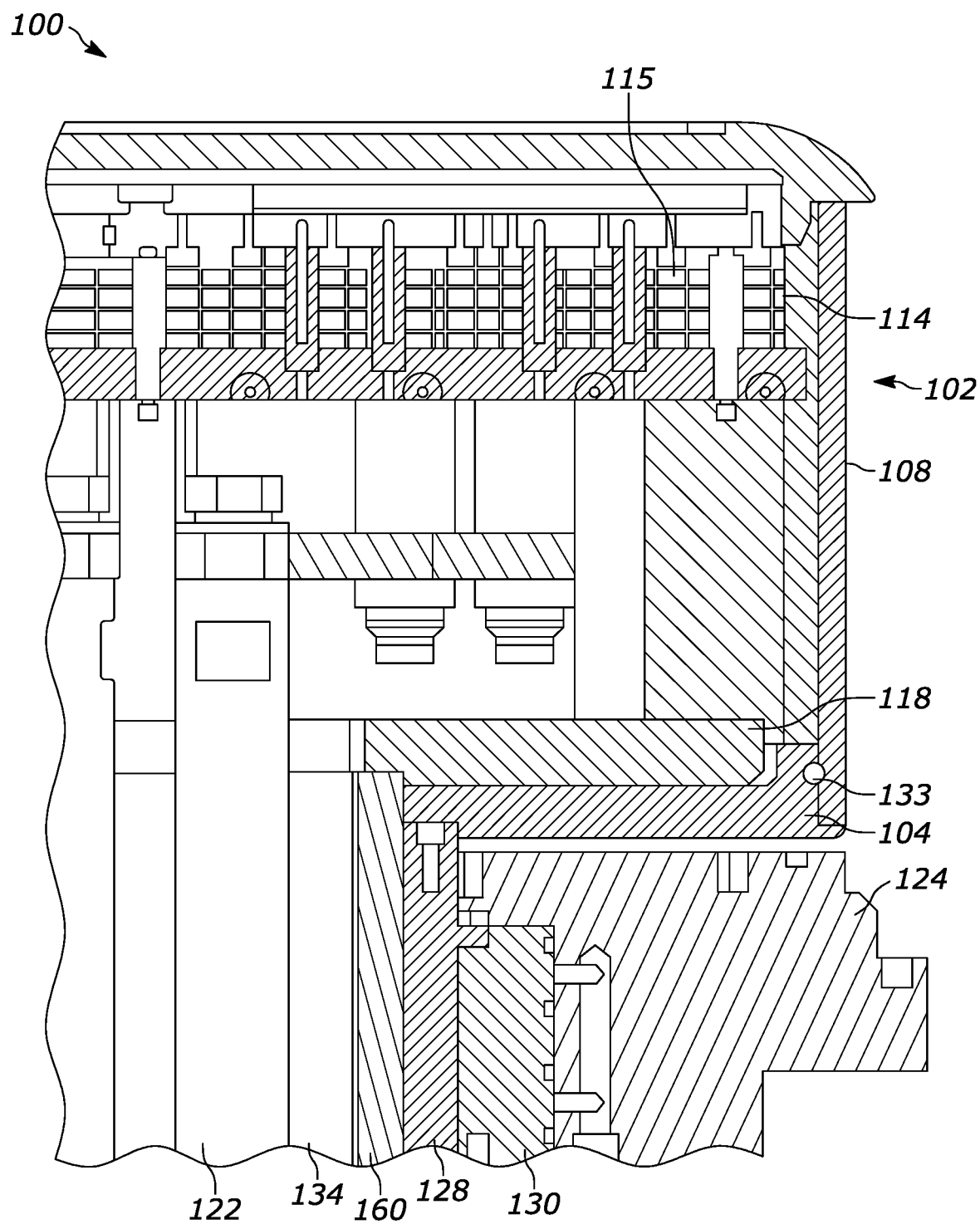
FIG. 2 illustrates an expanded view of a top corner of the cross section of the CVD reactor described in connection with FIG. 1.

FIG. 2 illustrates an expanded view of a top corner of the cross section of the CVD reactor 100, described in connection with FIG. 1, showing the vacuum regions formed by the upper ferrofluid seal 130. The expanded view shows the top corner of the vacuum chamber 102 with the turntable 104 and dielectric support 108. The heater assembly 114 is also shown, including the heater base plate 118 and the electrodes 122 that passes through a hollow conduit 134 and connect with the heating elements 115. The shaft 128 is shown passing through the upper ferrofluid seal 130 and connecting with the turntable 104. With this design, vacuum is present inside the chamber 102 walls, outside and inside the dielectric support 108, and in the gaps above and below the turntable 104.

Figure 3:
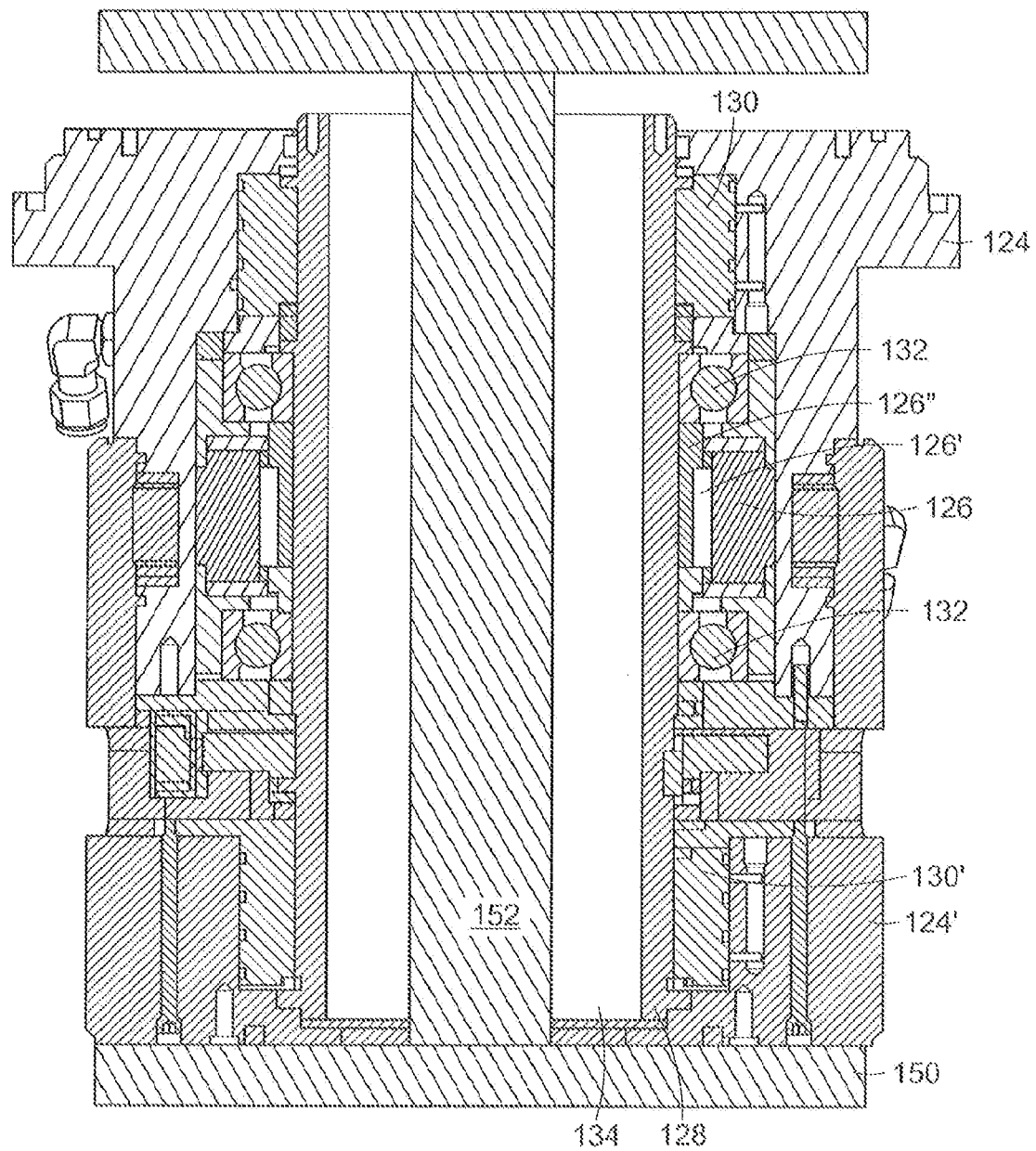
FIG. 3 illustrates a simplified view of the entire ferrofluid feedthrough, showing the heater mounting flange and heater support structure.

FIG. 3 illustrates a simplified view of the entire ferrofluid feedthrough, showing the heater mounting flange 150 and heater support structure 152. Referring to FIGS. 1, 2 and 3, the ferrofluid feedthrough includes the hollow conduit 133 that is large enough to enclose structures that provide utilities for the heater assembly 114 positioned inside the dielectric support 108. In the embodiment shown, the hollow conduit 134 includes space for enclosing the heater support structure 152 that supports the heater assembly 114, which is positioned inside the rotating dielectric support structure 108. The hollow conduit 134 also includes space for the electrodes 122, which power the heater assembly 114 and space for fluid cooling lines.

The upper end of a heater support structure 152 is attached to the heater assembly 114. The lower end of the heater support structure 152 is rigidly attached to the heater mounting flange 150 that is bolted to the bottom of the CVD chamber 100. The heater mounting flange 150 includes an o-ring or other type of vacuum seal. The electrodes 122 and fluid cooling lines pass through the mounting flange 150 where they are connected to utilities outside of the CVD reactor 100. The heater support structure 152, electrodes 122, and fluid cooling lines remain stationary as the shaft 128 rotates.

The upper housing 124 that encloses the motor 126 firmly clamps the outer races of the bearings 132 and the stator 126' of the motor 126 in position. The shaft 128 firmly clamps the inner races of the bearings 132 and rotor 126" of the motor 126 in position. The upper and lower ferrofluid vacuum seals 130, 130' are positioned in the housing above and below each bearing 132. The upper and lower ferrofluid vacuum seals 130, 130' dynamically seal vacuum where they contact the outer diameter of the shaft 128. In some embodiments, there are holes through the wall of the upper and lower housing 124, 124' in the area proximate to the motor 126 and to the bearings 132 so that these components can communicate with the ambient environment. This arrangement allows the bearings 132 and motor 126 to operate in a benign atmospheric pressure environment while the shaft 128 penetrates through the dynamic seals and provides rotary motion inside the evacuated chamber 102 where processing occurs.

Figure 4A:
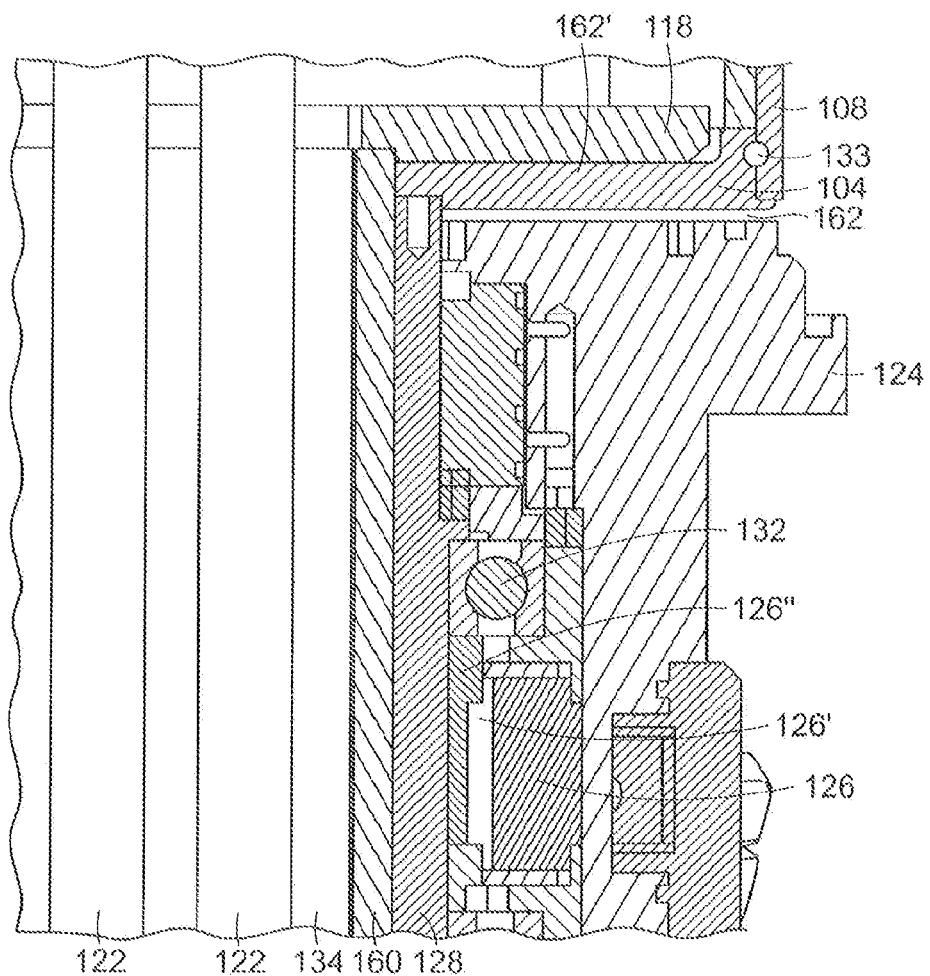
FIG. 4A illustrates a cross-sectional view of the upper portion of the ferrofluid feedthrough and surrounding components, including details of the motor.
Figure 4B:
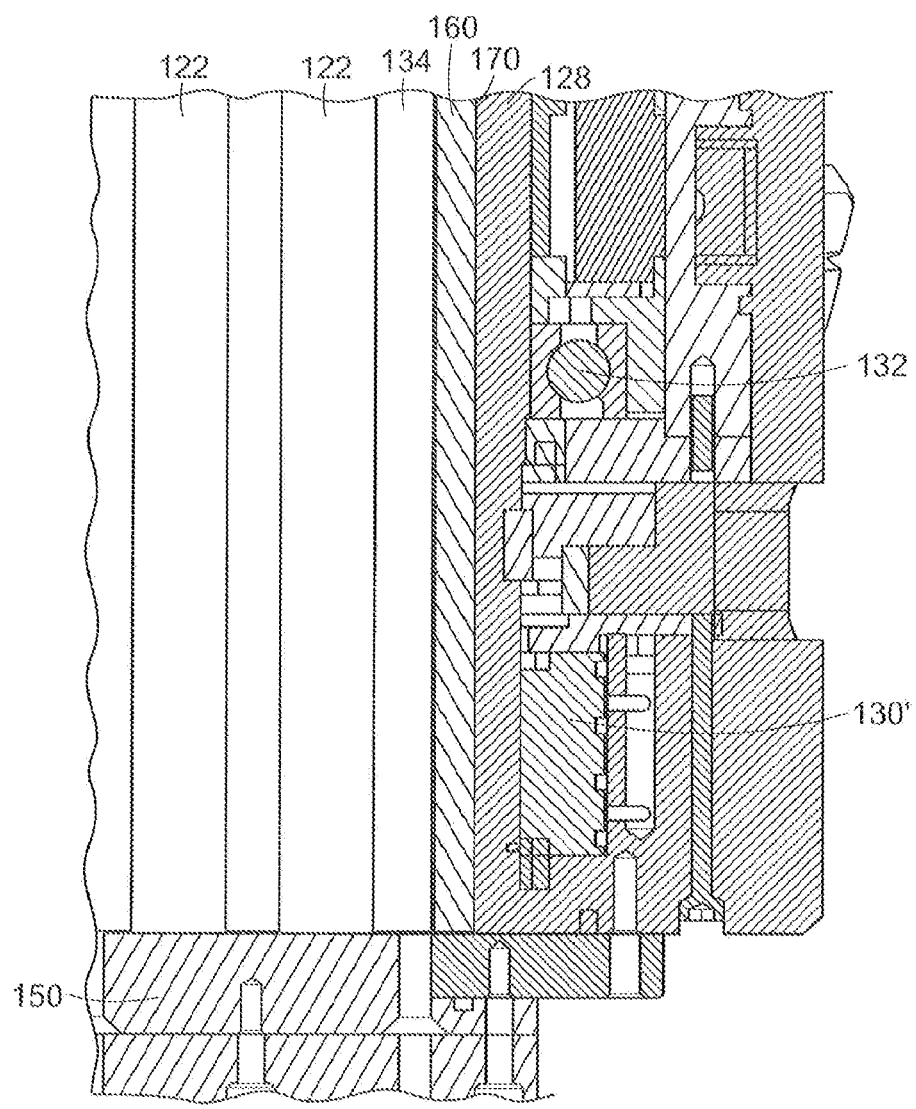
FIG. 4B illustrates a cross-sectional view of the lower portion of the ferrofluid feedthrough and surrounding components, including the mounting flange.

FIGS. 4A and 4B illustrate a more detailed view of the upper and lower ferrofluid seals 114, 114', more clearly illustrating the vacuum regions. Suitable ferrofluid seals are commercially available from FerroTec Corporation of Santa Clara, Calif. These ferrofluid seals are suitable for the CVD system according to the present teaching. In particular, these ferrofluid seals do not need any additional lubrication. In addition, these ferrofluid seals can operate over a wide range of parameters and they can hold a minimum of 1.5× delta pressure. The rotation rate range of the ferrofluid seal is from less than one rmp to over 10,000 rpm, but for high-speed operation it is important to ramp the operating speed slowly. The speed range is shaft diameter dependant. This rotation rate change is suitable for CVD processing. The temperature range of the ferrofluid seal is from about 0 degree C. to 200 degrees C. The practical operating range of the ferrofluid seal with proper heating or cooling is −100C to 2000C, which is well within the range of the CVD system of the present teaching. The operational lifetime for the ferrofluid seal is normally between about five and ten years, but many such ferrofluid seals have a known lifetime of over twenty years.

FIG. 4A illustrates a cross-sectional view of the upper portion of the ferrofluid feedthrough and surrounding components, including details of the motor. Referring to both FIGS. 1 and 4A, the upper ferrofluid seal 130 is positioned proximate to the upper corner of the CVD reactor 100. The upper housing 124 encloses the upper ferrofluid seal 130 in the CVD reactor 100. The turntable 104 with the heater base plate 118 and dielectric support 108 are shown. FIG. 4A also shows a heater mounting tube 160 connected to the heater base plate 118.

With this design, vacuum is present inside the vacuum chamber 102, including the area surrounding the electrodes 122, outside of the dielectric support 108, inside the dielectric support 108, in the gap 162 above the turntable 104, and in the gap 162' below the turntable 104. In addition, the entire inner diameter of the shaft 128 is in vacuum. Also, the upper end of the shaft 128 is completely in vacuum. The outer diameter of the shaft 128 passes through the upper ferrofluid seal 130 near the upper end of the shaft 128. Below the ferrofluid upper seal 130, the outer diameter of the shaft 128 is at atmospheric pressure, along with the upper bearing 132 and the motor 126.

Positioning the bearing 132 and the motor 126 in atmosphere has numerous performance and maintenance advantages. One advantage is that positioning the bearings in air allows them to be more easily cooled and provides an environment where they can be lubricated to increase their efficiency and lifetime. Another advantage is that numerous commercially available standard motors can be used and that these motors can be more easily cooled.

The view of the ferrofluid seal shown in FIG. 4A also illustrates details of the motor 126 and bearings. The rotor 126" is positioned in contact with the shaft 128. The stator 126' is positioned behind the rotor 126". Numerous types of motors can be used with the CVD reactor according to the present teaching. The motor 126 can be removed by removing the upper housing 124. The bearing 132 is positioned above the rotor 126" in the atmospheric region below the upper ferrofluid seal 130.

FIG. 4B illustrates a cross-sectional view of the lower portion of the ferrofluid feedthrough and surrounding components including the mounting flange 150. The view of the lower portion of the ferrofluid feedthrough 130' shows many of the same components as the view of the upper ferrofluid feedthrough described in connection with FIG. 3A, including the electrodes 122, the heater mounting tube 160, shaft 128, and bottom of the motor 126. A bearing 132 is positioned adjacent to the stator 126'. In addition, the lower ferrofluid seal 130' is positioned adjacent to the bearing 132.

The components above the lower ferrofluid seal 130', such as the bearing 132 and lower portion of the motor 126, are at atmospheric pressure. The area below the lower ferrofluid seal 130' is under vacuum. Also, the entire inner diameter of the shaft 128 is in vacuum. There is also a vacuum gap 170 between the shaft 128 and the heater mounting tube 160. In addition, the lower end of the shaft 128 is completely in vacuum. Near the lower end of the shaft 128, the outer diameter of the shaft 128 passes through the lower ferrofluid seal 130' proximate to the mounting flange 150.

Figure 5:
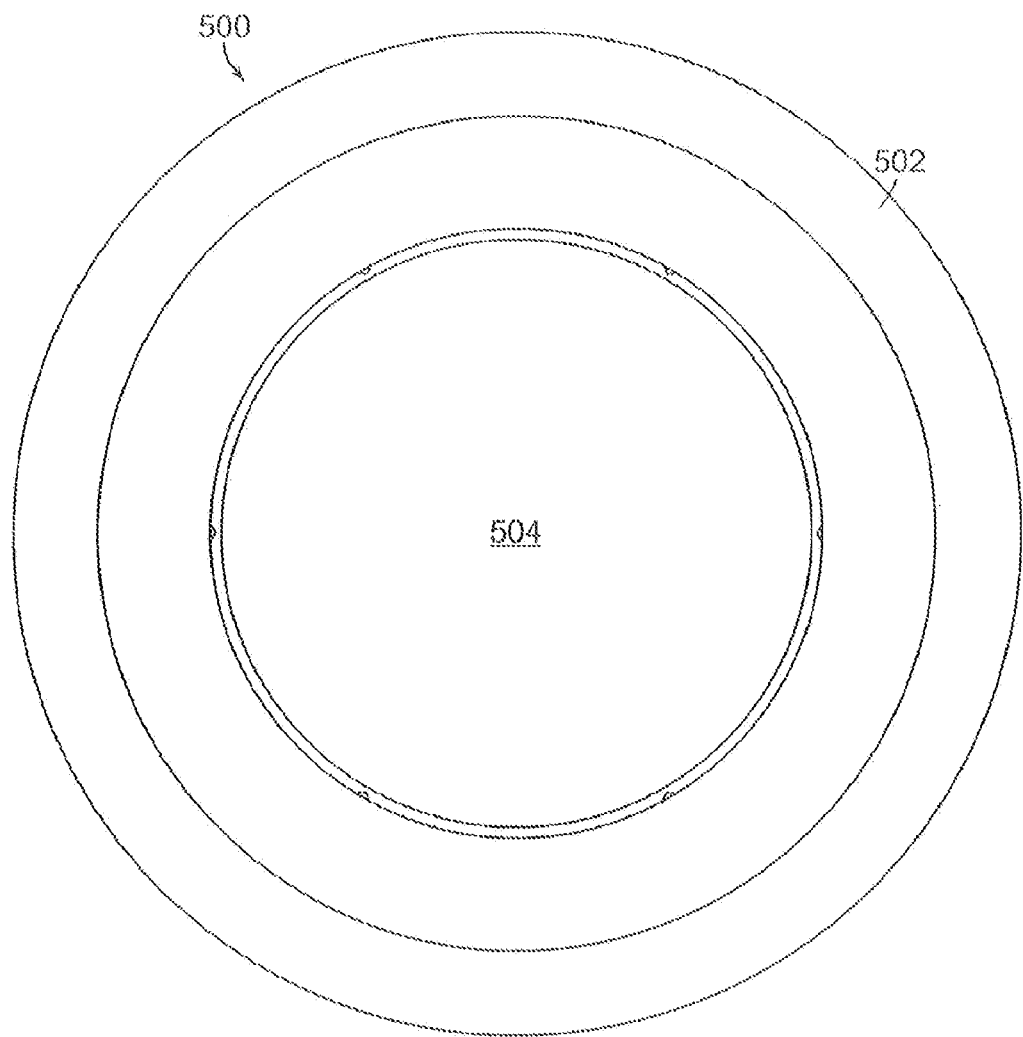
FIG. 5 illustrates a top-view of a single substrate carrier, according to the present teaching.

FIG. 5 illustrates a top-view of a single substrate carrier 500 according to the present teaching. The substrate carrier 500 can be formed of numerous types of materials, such as graphite, SiC, metal, and ceramic material. For some embodiments of the present teaching, it is desirable to form the substrate carrier 500 of a material that can be easily machined in localized areas or in a predetermined contour. In other embodiments, it is desirable to form the substrate carrier 500 of a material that can easily accept additional materials in localized areas. In yet other embodiments, it is desirable to form the substrate carrier 500 of a material that can accept inserts of different materials or the same material with a different orientation, or with modified properties in localized areas.

The substrate carrier 500 is circular with a rounded edge 502. The substrate carrier, according to the present teaching, can have any one of many different types of rounded edges and these rounded edges can be chamfer or beveled edges. In many embodiments, the rounded edge of the substrate carrier 500 is the same throughout the substrate carrier 500. However, in some embodiments, the rounded edge is different in various areas of the substrate carrier 500 to affect the flow of process gases.

The substrate carrier 500 has a recessed area 504 for receiving a substrate. The recessed area 504 is centrally positioned for a single substrate. The recess depth of the recessed area 504 is deep enough to secure the substrate at the desired rotation rate used during normal processing conditions. In addition, the radial dimensions of the recess are such that no significant wobbling of the substrate occurs during normal processing conditions.

The thickness of the substrate carrier 500 can be optimized for various processes. A thinner substrate carrier 500 generally has a better thermal response time. However, a thicker substrate carrier 500 generally has better thermal uniformity. The thickness of the substrate carrier 500 can be optimized for the best compromise between thermal response time and thermal uniformity for a particular process.

The weight of the substrate carrier 500 is also important. The substrate carrier 500 must have enough mass to maintain its position on top of the dielectric support during normal processing conditions. This requirement is relatively easy to satisfy because the flow of process gases will force the substrate carrier 500 into contact with the top of the dielectric support 108. In addition, the substrate carrier 500 must have enough mass to maintain its position on top of the dielectric support 108 while being purged from below. This requirement is more difficult to satisfy because purging creates a net positive pressure between the inside and the outside of the dielectric support that imparts a lifting force on the substrate carrier 500.

Also, a heavier substrate carrier 500 will generally result in improved isolation between the heater 114 and the vacuum chamber 102. Such a heavier substrate carrier 500 will have a relatively high thermal mass, which will result in increased thermal stability and increased thermal uniformity, but a relatively slow thermal response time.

Figure 6:
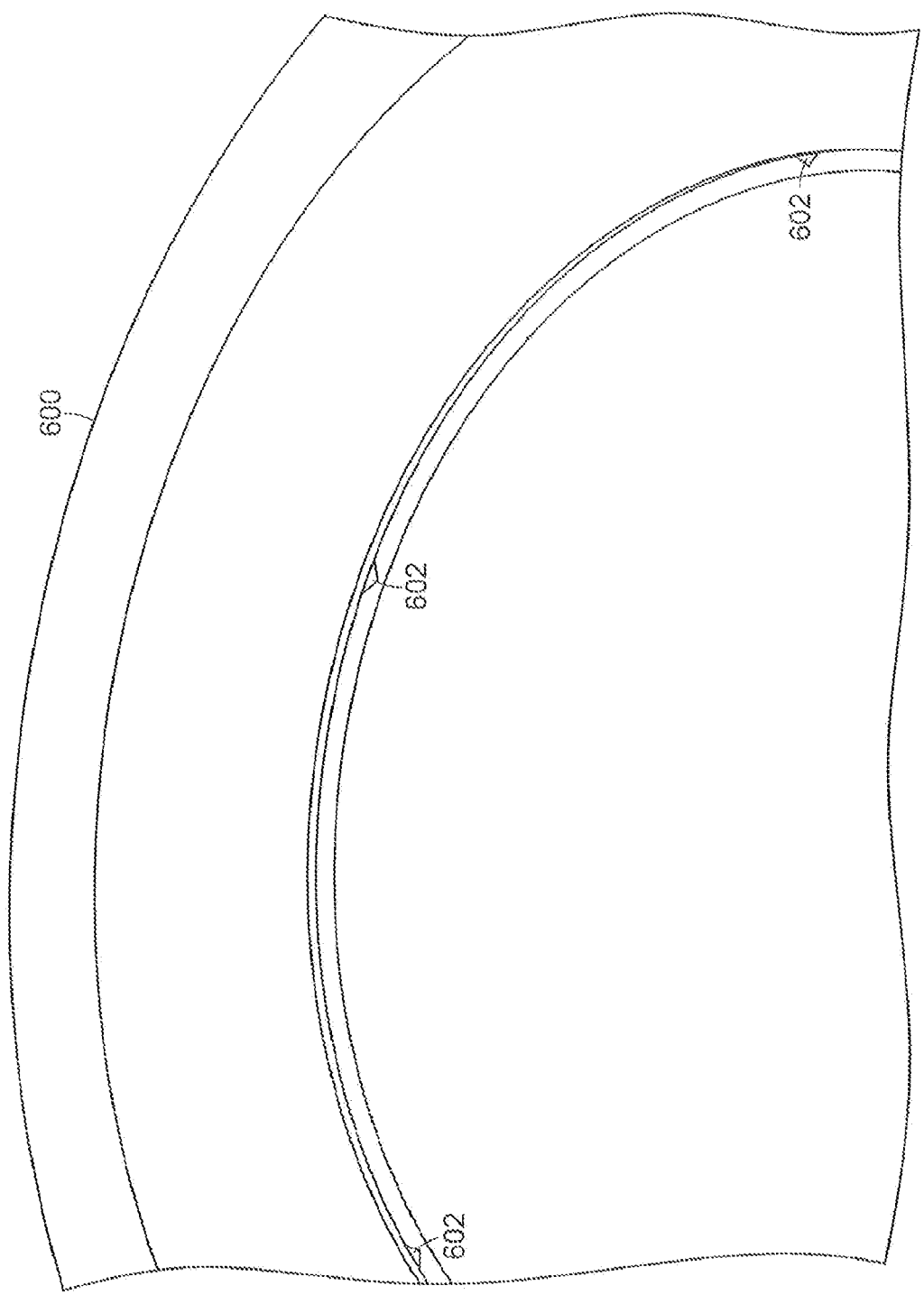
FIG. 6 illustrates an expanded top-view of the single substrate carrier, according to the present teaching, that was described in connection with FIG. 2.

FIG. 6 illustrates an expanded top-view of the single substrate carrier 500, according to the present teaching, that was described in connection with FIG. 5. The expanded top view 600 shows a plurality of tabs 602 that are used to support the substrate. The substrate rests on these tabs 602 during processing. Numerous types of tabs can be used. For example, the tabs 602 can be triangular-shaped tabs 602, as shown, that are positioned at several locations along the edge of the substrate carrier 602. This is because the substrate carrier 500 expands as its temperature is ramped to the desired processing temperature, while the dimensions of many types of substrates remain essentially the same. The tabs 602 are dimensioned so that they support the substrate over the entire operating temperature range of the processes.

FIG. 7 illustrates a side-view of the single substrate carrier 500, according to the present teaching, that was described in connection with FIG. 5. The substrate carrier 500 is positioned on top of the dielectric support 108. The side-view illustrates the rounded edge 502 of the substrate carrier 500 with a flat bottom surface 506, which contacts the top of the rotating dielectric support 108. In the embodiment shown in FIG. 4, the substrate carrier 500 is held in place on top of the rotating dielectric support 108 by only friction. That is, the weight of the dielectric support 108 and the coefficients of friction of the top surface of the dielectric support 108 and that of the flat bottom surface 506 of the edge 502 of the substrate carrier 500, are such that the substrate carrier 500 does not slip while rotating at the desired rotation rate during normal processing conditions and while a pressure differential is established during purging.

The substrate carrier 500 also includes a vertical rim 508 that is aligned with the inside surface of the rotating dielectric support 108. The vertical rim 508 is positioned and dimensioned such that the substrate carrier 500 does not wobble when it is rotating at the desired rotation rate during normal processing conditions. The coefficient of thermal expansion of the dielectric support 108 is very low compared with the coefficient of thermal expansion of the substrate carrier 500. Therefore, as the temperature of the substrate carrier 500 is ramped up to the processing temperature, the substrate carrier 500 expands and the gap between the vertical rim 508 and the inside wall of the rotating dielectric support 108 reduces, thereby holding the substrate carrier 500 more firmly and reducing wobble.

The side-view of the single wafer substrate carrier 500 more clearly illustrates the rounded edge 502. Rounding the edge 502 of the substrate carrier 500 has numerous features and advantages. The rounded edge 502 of the substrate carrier 500 reduces the surface area of the substrate carrier 500 at the edge 502. A reduction in surface area results in less thermal mass at the edges 502 and, therefore, less thermal losses at the edge 502 of the substrate carrier 500. In particular, there will be significantly lower radiative heat loss at the edge 502.

In addition, the rounded edge 502 of the substrate carrier 500 results in a more uniform flow of process gasses over the surface of the edge 502. A more uniform flow of process gases at the edge 502 improves the uniformity of process gas flowing across the surface of the substrate being processed. Furthermore, the rounded edge 502 reduces the need to heat the edge of the substrate carrier 502 to a higher temperature compared with the inner portions of the substrate carrier 500 because the rounded edge 502 will radiate much less heat during normal operating conditions.

Furthermore, the side-view of the single substrate carrier 500 shown in FIG. 4 more clearly illustrates the recess area 504 for receiving the substrate. The depth of the recess area 504 and the flatness of the bottom surface of the recess area 504 are important variables that determine the temperature uniformity across the substrate being processed and, therefore, the thickness uniformity of the films grown by CVD. More specifically, the temperature at the growth surface of the substrate depends on the temperature of the substrate carrier 500 and on the heat transfer between the substrate carrier 500 and the substrate.

Heat transfer can occur through conduction, convection, radiation, or through a combination of heat transfer mechanisms. The conduction and convection models of heat transfer are not particularly accurate for CVD processing. The conduction model is most accurate for smaller substrates where typically there are only relatively small gaps between the substrate and the substrate carrier, on order of 50-100 microns. A hybrid conduction-convection model assumes that heat transfer occurs through both conduction and convection. This model is more accurate for larger substrates where there can be larger gaps between the substrate and the substrate carrier, which can be on order of 300-500 microns. For example, eight inch substrates can have relatively large gaps between the substrate and the substrate carrier that result in significant amounts of both conduction and convection heat transfer. A radiation model of heat transfer assumes that heat transfer occurs through radiation. This model is accurate for some processes that use opaque substrates, such as silicon substrates.

The temperature of the growth surface of the substrate is also affected by numerous other non-uniformities in the material processing system. For example, the temperature of the growth surface of substrate is affected by non-uniformities in the process gas flow over the substrate, edge effects near the walls of the process chamber, and numerous other defects and asymmetries in the processing system.

In addition, the shape of the substrate affects the temperature of the growth surface of the substrate. In particular, substrates are usually not completely round. Substrates typically include an orientation flat and they also tend to bow and warp during processing. Substrate bow is the deviation of the center point of the median surface of a free, unclamped substrate from the median surface reference plane established by three points equally spaced on a circle with a diameter being a specified amount less than the nominal diameter of the substrate. Like bow, warp is a measurement of the differences between the maximum and minimum distances of the median surface of a free, unclamped substrate from a reference place. Bow and warp of the substrate are functions of many factors, such as internal stress of the substrate, the deposition temperature, the structure being grown on the substrate, and temperature gradients in the process chamber.

Many material processes require very high yields to be competitive in the industry. For example, it is highly desirable to achieve a high process yield of LED and semiconductor laser devices for these devices to be competitive in the industry. In particular, there is currently a need in the industry to improve the yield of VPE processes to manufacture LED and semiconductor laser devices. For many LED and semiconductor laser applications, it is critical to achieve a precise emission wavelength within a few nanometers that is stable over time. Devices with emission wavelengths outside of a certain narrow, predetermined range are discarded or sold at a discounted price, reducing the target process yield.

The emission wavelength of these devices depends strongly on the growth temperature and on the solid phase composition of at least some of the semiconductor layers. In particular, growing multiple quantum well structures with the desired emission wavelength and optical properties requires precise control over the temperature, layer thickness, and composition at the growth surface of the substrate. Therefore, the growth temperature must be precisely controlled to achieve uniform material properties over the entire growth surface of substrate in order to achieve a high process yield. Even if the temperature is completely uniform over the substrate, there still could be significant variations in the emission wavelength due to gas phase depletion or compositional differences within the deposition chamber. Therefore, it is sometimes desirable to intentionally induce a temperature non-uniformity to compensate for gas phase and other non-uniformity. In many instances, it is desirable to use the temperature as a control variable since local gas phase composition cannot be easily manipulated.

Therefore, one aspect of the present teaching is a method of manufacturing or modifying the substrate carriers described herein to modify temperature uniformity over the substrate being supported by the substrate carrier. In various embodiments of the present teaching, the temperature uniformity can be improved or intentionally reduced in order to improve the process performance. Thus, in some methods of the present teaching, the substrate carrier 500 is fabricated or modified to match the curvature of the surface of the substrate so that the substrate has a more uniform temperature at the growth surface. In other methods, the substrate carrier is fabricated or modified to provide a predetermined temperature profile over the substrate being supported by the substrate carrier.

It is difficult in many cases to accurately measure and control the temperature of substrates being processed and/or local gas phase composition in the process chamber, in order to obtain information necessary to fabricate or modify the substrate carrier to compensate for non-uniformities on the surface of the substrate and to compensate for other non-uniformities in the processing system. Temperature measurement is especially difficult when the substrates are optically transparent. One method of modifying a substrate carrier to improve processing performance, according to the present teaching, includes post growth measurement or analysis of the substrate or devices fabricated on the substrate. The resulting data obtained from the measurement and analysis is then used to modify the substrate carrier, or to fabricate a new substrate carrier with specifications that compensate for non-uniform process parameters associated with the substrate, such as temperature and/or gas phase non-uniformities, due to non-uniformities in the processing system.

In a method according to the present teaching, one or more parameters of devices fabricated on a substrate, positioned on the substrate carrier 500, are measured as a function of their corresponding positions on the substrate carrier. The parameters can be any type of parameter, including, but not limited to, optical parameters, electrical parameters, or electro-optic parameters. For example, the parameters can be performance metrics of an electrical or an optical device. In one specific embodiment, the parameter measured is the wavelength of optical emission generated by an optical device, such as a light emitting diode or a semiconductor laser. The resulting data obtained from the measurement and analysis are then used to modify the substrate carrier 500 or to fabricate a new substrate carrier 500 that can be used to fabricate devices with desired characteristics. The substrate carriers 500 can be modified by removing material in predetermined areas, or by adding material in predetermined areas, or any combination of removing and adding materials in various predetermined areas. The material added can be the same material as the substrate carrier 500, or can be a different material.

In one embodiment, according to the present teaching, the substrate carrier 500 has a multi-step recess for supporting a substrate during processing. One aspect of the present teaching is that small changes in the step height and/or thermal conductivity of the substrate carrier 500 under the step can change the temperature at the growth surface of the substrate so that it has a more uniform temperature profile or has a predetermined desired temperature profile. See for example, U.S. patent application Ser. No. 12/629,467, filed Dec. 2, 2009, entitled "Method for Improving Performance of a Substrate Carrier," which is assigned to the present assignee. The entire specification of U.S. patent application Ser. No. 12/629,467 is herein incorporated by reference.

Another aspect of the present teaching is that a slotted dielectric support 108 can be used to provide mechanical centering of substrate carrier 110 for chemical vapor deposition. Mechanical locking is provided between substrate carrier 110 and the dielectric support 108 in order to improve mechanical centering and reduce eccentricity during processing. Eccentricity is a significant factor that causes non-uniform heating and ultimately non-uniform device processing, and can result in a lack of thin film stack integrity.

Figure 8A:
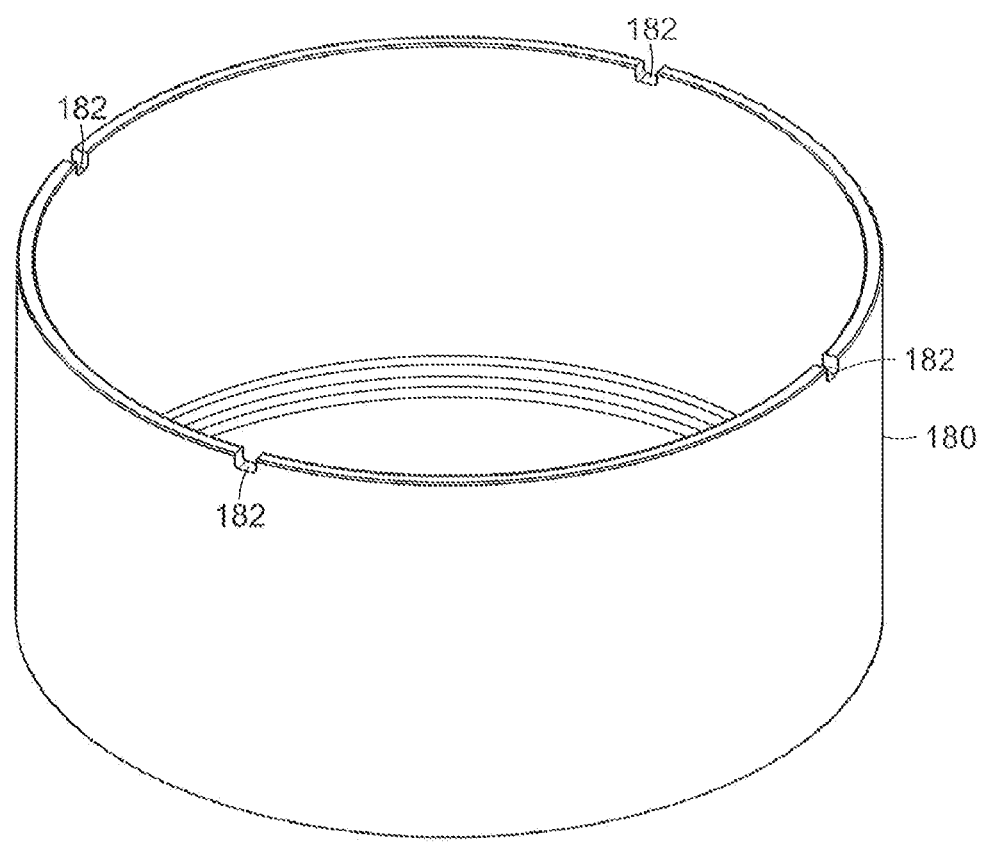
FIGS. 8A and 8B illustrate a dielectric support and substrate carrier, adapted with pins, that more firmly attaches the dielectric support to the substrate carrier, while they are being rotated by the turntable.
Figure 8B:
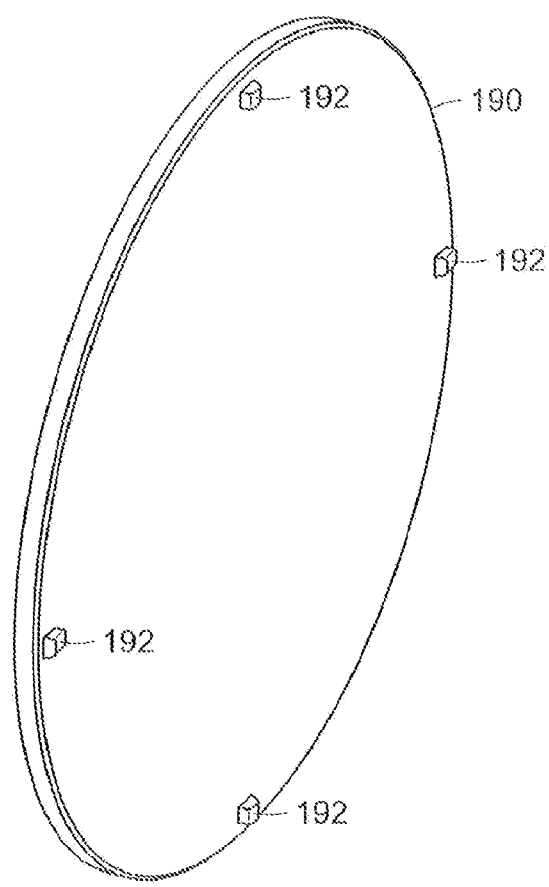

FIGS. 8A and 8B illustrate a dielectric support 180 and substrate carrier 190 adapted with pins that more firmly attach the substrate carrier 190 to the dielectric support 180 while they are being rotated by the turntable. Referring to both FIGS. 8A and 8B, FIG. 8A illustrates a perspective view of the dielectric support 180 that includes slots 182 for mechanically locking the substrate carrier 190 to the dielectric support 180, according to the present teaching In various embodiments, slots 182 can be provided from the top of the dielectric support 180 down, in various lengths, to improve mechanical centricity in design. Mechanically locking substrate carrier 190 to the dielectric support 180 is accomplished with a plurality of pins 192. In some specific embodiments, three or four locking pins 192 are used. FIG. 8B shows a perspective view of a substrate carrier 190, including pins 192, that lock into the top of the dielectric support 180.

In other embodiments, a locking mechanism comprising a cutout on the substrate carrier 110, 190 can be used. For example, a cutout on the substrate carrier 110, 190 coupled with a post sticking up from the dielectric support 108, 180 can be used. Using such a mechanism requires that the dielectric support 108, 180 and substrate carrier 110, 190 be pre-positioned, which adds to the complexity and time of the process, but has the advantage of being insensitive to speed compared with using only a slotted dielectric support.

Equivalents

While the applicant's teaching is described in conjunction with various embodiments, it is not intended that the applicant's teaching be limited to such embodiments. On the contrary, the applicant's teaching encompass various alternatives, modifications, and equivalents, as will be appreciated by those of skill in the art, which may be made therein without departing from the spirit and scope of the teaching.

What is claimed is:

1. A rotating disk reactor for chemical vapor deposition, the reactor comprising:
   a) a vacuum chamber;
   b) a ferrofluid feedthrough that passes a motor shaft into the vacuum chamber, the ferrofluid feedthrough comprising an upper and a lower ferrofluid seal positioned such that an upper end, a lower end, and an inner diameter of the motor shaft are all positioned inside the vacuum chamber and a portion of an outer diameter of the motor shaft below the upper ferrofluid seal and above the lower ferrofluid seal is at atmospheric pressure;
   c) bearings positioned adjacent to the motor shaft such that the outer diameter of the motor shaft firmly clamps inner races of the bearings and positioned below the upper ferrofluid seal such that the bearings are at atmospheric pressure;
   d) a motor positioned in an atmospheric region between the upper and the lower ferrofluid seal, the motor comprising a rotor positioned in contact with the portion of the outer diameter of the motor shaft below the upper ferrofluid seal and above the lower ferrofluid seal;
   e) a turntable positioned in the vacuum chamber and being coupled to the motor shaft so that the motor rotates the turntable at a desired rotation rate;
   f) a dielectric support coupled to the turntable so that the turntable rotates the dielectric support when driven by the shaft;
   g) a substrate carrier positioned on the dielectric support, the substrate carrier supporting substrates in the vacuum chamber for chemical vapor deposition processing; and
   h) a heater positioned proximate to the substrate carrier, the heater controlling the temperature of the substrate carrier to a desired temperature for chemical vapor deposition process.

2. The reactor of claim 1 wherein the ferrofluid feedthrough forms a hollow conduit for passing at least one of electrodes that power the heater or cooling lines to control the temperature in the vacuum chamber.

3. The reactor of claim 1 wherein the motor is directly coupled to the motor shaft.

4. The reactor of claim 1 wherein the motor shaft is mechanically coupled to the turntable.

5. The reactor of claim 1 wherein the motor shaft is magnetically coupled to the turntable.

6. The reactor of claim 1 wherein the motor shaft is coupled to the turntable in a region offset from a center of rotation of the turntable.

7. The reactor of claim 1 wherein the motor shaft is formed of a dielectric material.

8. The reactor of claim 1 wherein the dielectric support is coupled to the turntable with a flexible fastener.

9. The reactor of claim 8 wherein the flexible fastener comprises a canted coil spring that centers and locks the dielectric support to the turntable.

10. The reactor of claim 1 wherein the dielectric support is formed of a dielectric material having a thermal conductivity less than about 10 W/(m K).

11. The reactor of claim 1 wherein the dielectric support is formed of a material which forms a thermal barrier between the substrates being processed and a cool region in the vacuum chamber.

12. The reactor of claim 1 wherein the dielectric support is formed of quartz.

13. The reactor of claim 1 wherein the dielectric support comprises a cylindrical outer surface.

14. The reactor of claim 1 wherein the substrate carrier is held on top of the dielectric support by friction between a top surface of the dielectric support and a bottom surface of the substrate carrier.

15. The reactor of claim 1 wherein the substrate carrier comprises a single substrate carrier.

16. The reactor of claim 1 wherein the heater is positioned inside of the dielectric support proximate to the substrate carrier.

17. The reactor of claim 1 wherein the heater comprises at least two independent heater zones.

18. The reactor of claim 1 wherein the heater comprises a graphite heater.

19. The reactor of claim 1 wherein the heater comprises a coil heater formed of at least one of tungsten or rhenium.

20. The reactor of claim 1 wherein the dielectric support is slotted.

21. The reactor of claim 20 further comprising locking pins to secure slotted dielectric support to the substrate carrier.

\* \* \* \* \*